United States Patent [19]

Gregory et al.

[11] 4,220,626

[45] Sep. 2, 1980

[54] RF INDUCTION HEATING CIRCUITS FOR FLOAT ZONE REFINING OF SEMICONDUCTOR RODS

[75] Inventors: Robert O. Gregory, St. Louis; Louis H. Fricke, Jr., Maplewood, both of Mo.

[73] Assignee: Monsanto Company, St. Louis, Mo.

[21] Appl. No.: 896,121

[22] Filed: Apr. 13, 1978

Related U.S. Application Data

[63] Continuation of Ser. No. 731,869, Oct. 13, 1976, abandoned.

[51] Int. Cl.$^2$ .............................................. B01J 17/10
[52] U.S. Cl. ................................... 422/250; 331/169
[58] Field of Search ................... 156/620, 601; 13/26, 13/DIG. 1; 219/10.41, 10.75, 10.77; 331/169, 183; 422/250

[56] References Cited

U.S. PATENT DOCUMENTS

| | | | |
|---|---|---|---|
| 2,748,241 | 5/1956 | Mohr | 219/10.77 |
| 3,177,336 | 4/1965 | Fisher | 156/601 |
| 3,270,177 | 8/1966 | Prediger | 219/10.75 |
| 3,275,419 | 9/1966 | Spielmann | 156/601 |
| 3,644,151 | 2/1972 | Keller | 156/601 |
| 3,862,348 | 1/1975 | Keller | 219/10.43 |

FOREIGN PATENT DOCUMENTS

2425468 12/1975 Fed. Rep. of Germany .......... 156/620

*Primary Examiner*—Hiram H. Bernstein
*Attorney, Agent, or Firm*—Henry Croskell

[57] ABSTRACT

Apparatus for zone refining rods of semiconductive material is disclosed including an RF induction work coil having a single turn lying in a plane generally transverse to the lengthwise axis of the rod and encircling the rod. The coil is part of an RF power oscillator circuit including a power amplifying device (e.g. a vacuum tube) having a control electrode and a power output electrode, the latter being connected through a voltage-blocking capacitance to an input node of an inductive-capacitive tank circuit. The tank circuit includes the work coil and a capacitance. One input side of the work coil is connected in a circuit to the input node capacitance being connected between the input node and the other input side of the work coil. A grounded center tap of the coil serves as a ground node of the tank circuit.

The disclosure includes a circuit arrangement for supplying a signal of preselected magnitude to the control electrode for forcing the amplifying device toward desirable operating conditions.

13 Claims, 6 Drawing Figures

RF INDUCTION HEATING CIRCUITS FOR FLOAT ZONE REFINING OF SEMICONDUCTOR RODS

This is a continuation application of Ser. No. 731,869 filed Oct. 13, 1976, and now abandoned.

FIELD OF THE INVENTION

This invention relates to float zone refining of rods of semiconductor materials and more particularly to improved circuits for generating and coupling RF induction energy into such a rod to produce a molten zone therein during zone refining.

BACKGROUND OF THE INVENTION

Float zone refining or zone melting is a method which has been commercially employed for many years to produce monocrystalline semiconductor materials, such as silicon, having the extremely high purity and crystalline lattice structure without dislocations which are required for making certain electronic structures. The general float zone refining process is disclosed in Keller U.S. Pat. No. 2,992,311. A more recent commercial float zone refining process configuration is disclosed in Campbell U.S. Pat. No. 3,734,695.

Float zone refining of such semiconductor materials is often referred to simply as zone refining and the latter expression is used in this disclosure.

In this process or variations thereof, a molten zone is initially produced at a selected location on a silicon rod or other semiconductor rod by inductive radio frequency (RF) heating. Thereafter, the molten zone is moved along the rod by the production of relative motion between the rod and an adjacent RF induction heating coil encircling the rod. Such relative motion may be provided by well known mechanical means, such as motor driven shafts, and the traverse rate of the molten zone along the rod will depend upon the size of the molten zone employed and upon the power of the RF field produced by the adjacent induction heating coil. In the selection of the above parameters to determine this traverse rate, care must be taken to prevent zone fallout as will be appreciated by those skilled in the art.

DESCRIPTION OF THE PRIOR ART

In recent years, commercial demand has required zone refining of ever-increasing diameters of semiconductor rods. For example, it is commercially desirable to zone refine silicon rods having diameters of more than 100 mm. This has required corresponding increases in the size, efficiency and control effectiveness of circuits which are required to generate and couple by work coil to such a rod the RF induction energy which must produce a controlled molten zone in the rod for its zone refining.

When employing high-capacity RF induction heating circuits (e.g., with rated power in several tens of kilowatts) conventional practice has been to employ an RF power oscillator having a resonant output circuit, i.e., a so-called tank circuit, which is coupled to an RF induction work coil (hereinafter referred to as a work coil) by means of an impedance matching transformers intended to match high impedance oscillator circuitry to a low impedance work coil. Such transformers typically must be water cooled and absorb power, causing the circuit to be less efficient than desirable.

However, even when employing impedance-matching transformers of this type for zone refining of large diameter rods, it has been found that the RF power oscillator circuits employed (which typically require high power triode vacuum tubes) are often characterized by high voltages (e.g., more than 10 KV) and low currents (e.g., a few amperes). This implies that such oscillator circuits are operating into RF loads which are too high if the vacuum tube, which constitutes the power amplifying device of the circuit, is to be used up to the output power of which it is capable.

A closely related problem of oscillator circuits used for zone refining relates to control effectiveness. In zone refining, there is an interaction between the heat of the melt (i.e., the heat of the molten mass of semiconductor material constituting the molten zone), the size of the molten zone (which effects the magnitude of the RF load) and the power output of the oscillator circuit. Because of the interaction between these various entities, the oscillator circuit and its elements such as the vacuum tube are effected by changes in the heat and size of the molten zone. Consequently changes in the molten zone tend to cause changes in the magnitude of RF current circulating in the tank circuit. These changes in turn tend to produce undesirable, e.g., unstable or inefficient, operating conditions of the vacuum tube during its conduction angle, that is, the portion of the period of oscillation of the circuit during which the tube is conductive. It is desirable to make the circuit operate without such tendencies toward instability and operate more efficiently.

SUMMARY OF THE INVENTION

Among the several objects of the invention are the provision of improved apparatus for zone refining of semiconductor rods; the provision of such apparatus having RF power oscillator circuits which do not require impedance matching transformers between output circuitry thereof and the work coil employed for coupling RF power therefrom to a semiconductor rod; the provision of such circuits which provide more efficient power transfer to the work coil, which minimize undesirable operating conditions of the circuits, which are more stable, which provide for balanced voltage stresses on the work coil to minimize possibilities of arcing therefrom, which provide good control effectiveness, and which are simpler, less costly and more reliable in operation.

Briefly, these and other objects of the invention, some of which are in part apparent or in part pointed out hereinbelow, are attained by apparatus for zone refining rods of semiconductive material which includes means for positioning a rod of semiconductive material for zone refining, an RF induction work coil for RF induction heating of the rod to produce a molten zone in the rod by inductively coupling RF energy to the work coil. The coil has a single turn lying in a plane generally transverse to the lengthwise axis of the rod and encircles the rod. The apparatus includes means for causing relative movement between the coil and the rod to cause the molten zone to pass along the length of the rod. The invention contemplates an RF power oscillator circuit of this apparatus having a power amplifying device such as vacuum tube having a grid constituting a control electrode of the device and a plate constituting a power electrode thereof, the plate being connected through a voltage blocking capacitance to an inductive-capacitive tank circuit. The tank circuit comprises a capacitance and the work coil in parallel with the last-said capacitance. The work coil has a grounded center tap causing substantially equal peak voltages at the inputs of the coil.

A further aspect of the invention has to do with the fact that the vacuum tube or other amplifying device is periodically conductive only during a conduction angle substantially less than the period of oscillation of the oscillator circuit. In this context, changes in RF load on the tank circuit caused by changes in the molten zone in the semiconductor rod tend to cause changes in the magnitude of RF current circulating in said tank circuit which in turn tend to produce undesirable operating conditions of the vacuum tube during the conduction angle. Accordingly, control means of one of two types disclosed is interconnected with the grid for forcing the vacuum tube or other amplifying device toward desirable operating conditions.

DESCRIPTION OF THE PREFERRED EMBODIMENTS

Figure 1:
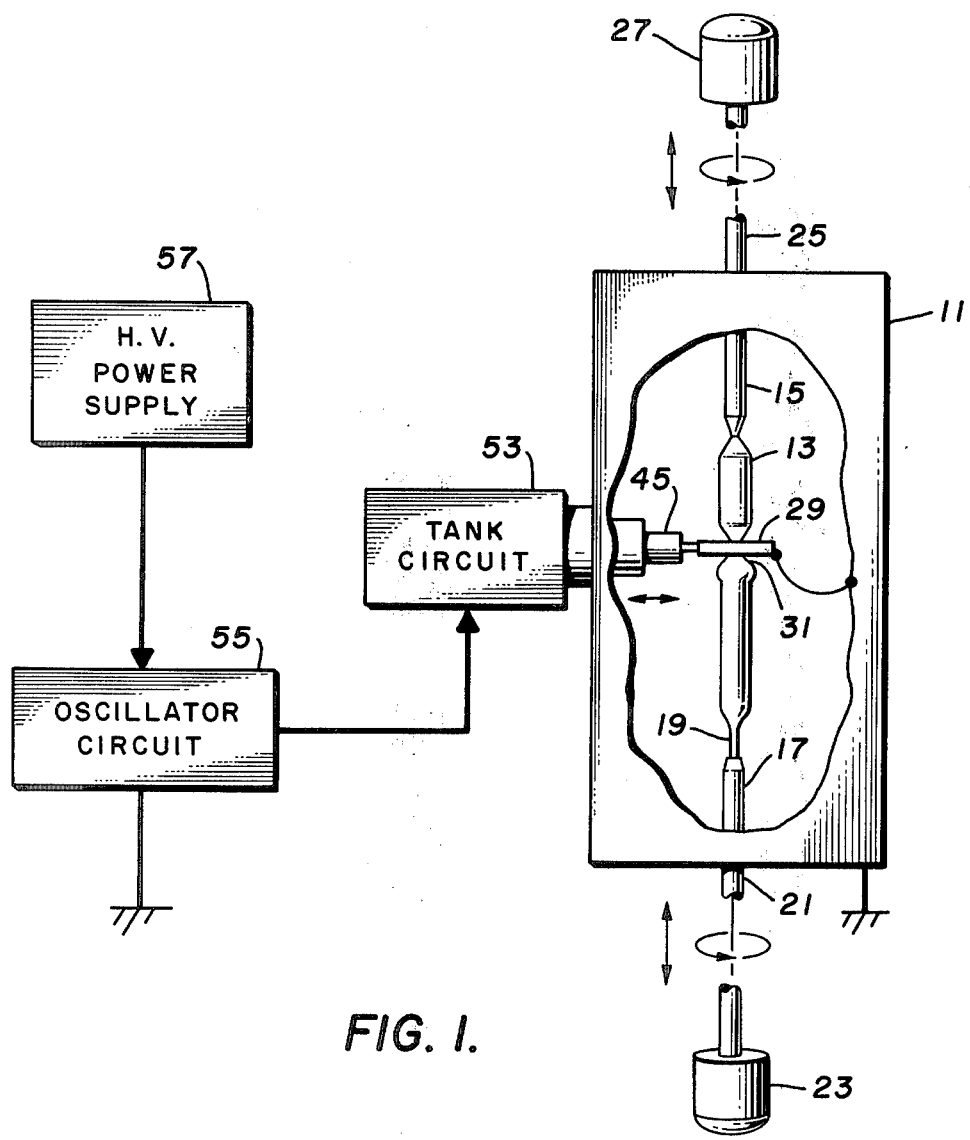
FIG. 1 is a partly diagrammatic, simplified side view of zone refining apparatus of the invention.

Referring now to FIG. 1, indicated at 11 is a chamber of zone refining apparatus employed in practicing the invention. Associated purge gas and dopant gas lines are not shown but will be understood by reference to Campbell U.S. Pat. No. 3,734,695. The introduction of purging and dopant gas mixtures into the chamber at appropriate times and/or rates during a zone refining operation will also be understood by reference to said Campbell patent.

As described in said Campbell patent, an elongate, generally cylindrical rod B of polycrystalline silicon or other semiconductor compound is placed in chamber 11 and is there suspended vertically by suspension from a rod holder 15 of conventional type. At 17 is indicated a chuck for holding a seed crystal 19 which, during an initial phase of the zone refining operation, is fuzed to the lower end of rod 13. Seed hold chuck 17 is supported atop a rotatable axially movable shaft 21 which extends from the lower end of chamber 11 and is journalled in a gas-tight seal for both rotation and movement in either vertical direction. A suitable drive means 23 is provided for producing a desired rate of rotation or rate or vertical movement, or both, of shaft 21.

Similarly, rod holder 15 is secured to a rotatable axially movable shaft 25 extending from the upper end of chamber A suitable drive means 27 is provided for producing desired rates of vertical or rotational movement, or both, of shaft 25.

Surrounding, that is encircling, silicon rod 13 is an RF induction heating coil or so-called work coil 29 for inductively coupling RF energy to the rod, the work coil having a single turn lying in a plane generally transverse to the lengthwise axis of the rod. This produces a molten zone 31 in the rod by induction heating. As will be understood, relative movement between work coil 29 and rod 13 is effected by means 23 and 27 to cause the molten zone to pass long the length of the rod. It will be apparent from FIG. 1 that the vertical position of work coil 29 with respect to chamber 11 is fixed, but that rod 13 is moved vertically with respect to chamber 11. While the work coil in this apparatus shown may, therefore, be regarded as vertically fixed and the rod vertically movable, the rod may instead be vertically fixed and the coil vertically movable.

Prior to beginning a zone refining operation, rod 13 is placed into chamber 11 through a suitable door or other aperture (not shown) which is then closed and sealed. In carrying out zone refining, the specific rates of relative movement between work coil 29 and rod 13, control of the gaseous environment within chamber 11, and other specific process parameters are beyond the purview of this description and are not necessary for an understanding of the present invention.

Figure 2:
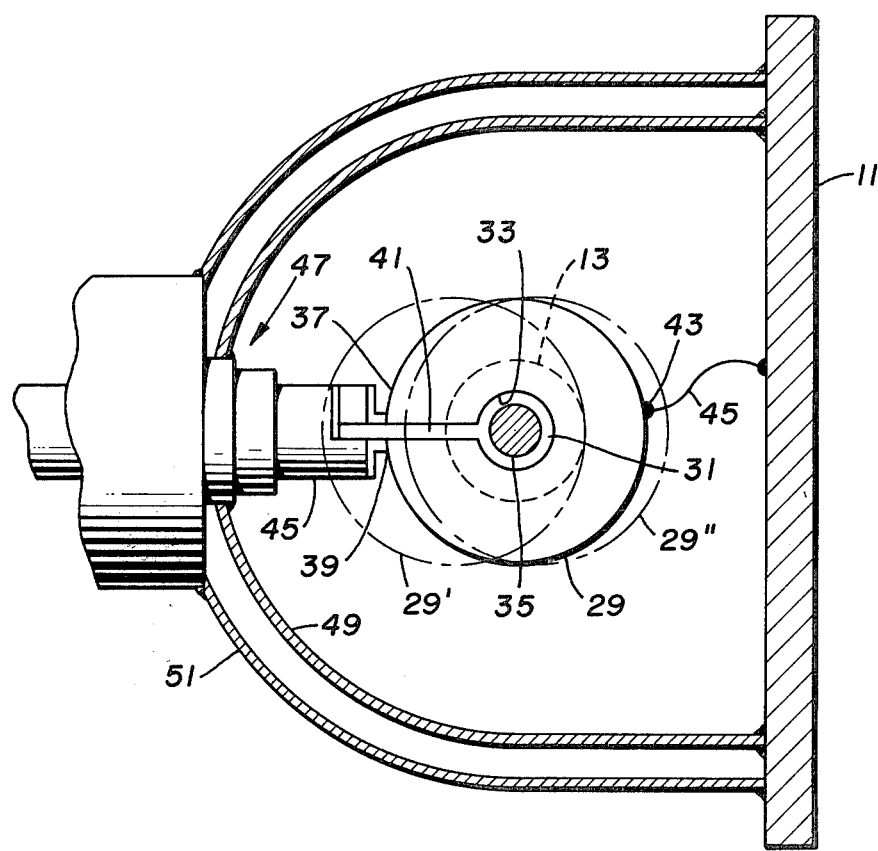
FIG. 2 is plan view of a work coil configured in accordance with the invention.

Referring now also to FIG. 2, work coil 29 is of a generally flat, annular configuration having a central opening or bore 33 accommodating a portion 35 of the molten zone 31. The coil also has opposite input sides 37 and 39 to which an RF signal of a suitable frequency, such as about 3 MHZ, is supplied to the coil. These input sides 37 and 39 are defined by a slot 41 which extends between bore 33 and the outer periphery of coil 29. The coil is provided with a center tap 43 which is connected by a suitable conductor 45 to the interrior surface of chamber 11. Tap 43 is at the electrical center of work coil 29, as opposed to being merely physically centered between input sides 37 and 39 opposite slot 41. Chamber 11 is at ground potential.

The RF signal is supplied to work coil 29 by a coaxial transmission line having a neck 45 which extends from a suitable seal designated generally at 47, the latter providing for gas-tight relationship between the coaxial line and the chamber 11. It may be noted that the chamber is double-walled, having an inner wall 49 and an outer wall 51. The seal 47 also is adapted for permitting neck 45 and hence work coil 29 to be moved axially in or out of the seal. In this way work coil 29 may be moved radially with respect to rod 13 as is desirable, for example, at the initiation of a zone refining operation. The extreme positions of work coil 29 when so moved in or out of seal 47 are shown in phantom at 29' and 29".

Referring again to FIG. 1, at 53 is represented a so-called tank circuit, that is a circuit resonant at the predetermined frequency previously noted which is generated by an oscillator circuit 55. A high-voltage power supply 57 provides a suitable source of power for operation of oscillator circuit 55.

Figure 3:
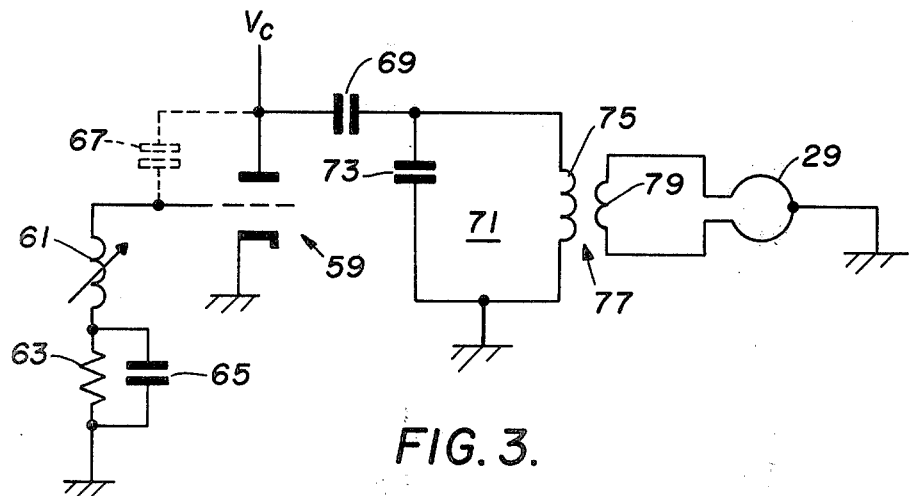
FIG. 3 is a schematic circuit diagram which illustrates a prior art RF power oscillator circuit.

The circuit elements of a prior art oscillator circuit and its associated tank circuit as used to supply an RF signal to work coil 29 are shown in FIG. 3. There, it will be seen that the oscillator circuit comprises a conventional power amplifying triode vacuum tube 59 having a grounded cathode (the heater for which is not shown to simplify the drawing) and a grid connected to a grid tuning inductor 61. The other side of inductor 61 is connected to a conventional grid leak resistor 63 and a bypass capacitor 65. The intrinsic capacitance between the grid and plate of triode 59 is shown in dashed lines at 67. A plate supply voltage VC of suitable positive potential is provided for the plate. Accordingly, as will be apparent, such a circuit will oscillate at a predetermined frequency.

RF power from the oscillator is coupled from the plate through a voltage-blocking capacitor 69 to a tank circuit 71 comprising a capacitor 73 connected in parallel with the primary winding of an impedance matching transformer 77. The secondary winding 79 of the latter is connected to work coil 29.

Transformer 77 may be required to be water cooled if several tens of killowatts of RF power must be coupled from tank circuit 71 to work coil 29. In any event a transformer of this type is relatively inefficient and there may dissipate as much as nearly half of the RF power desirably coupled to the work coil. The purpose of such a transformer is, on the hand, to transform the impedance of the work coil 29 and the molten zone to that of the power oscillator circuitry.

However, in practice it has been found that, in zone refining larger diameter (e.g., 50 to 75 mm or so) rods, oscillator circuits of the configuration shown in FIG. 3 have operating points characterized by high average plate voltages (e.g., 10-12 kilovolts) and low average plate currents (e.g., 1-2 amperes). This implies that the oscillator circuits are operating into RF loads which are two high if the vacuum tube 59 is to be used up to the output power of which it is capable.

Figure 4A:
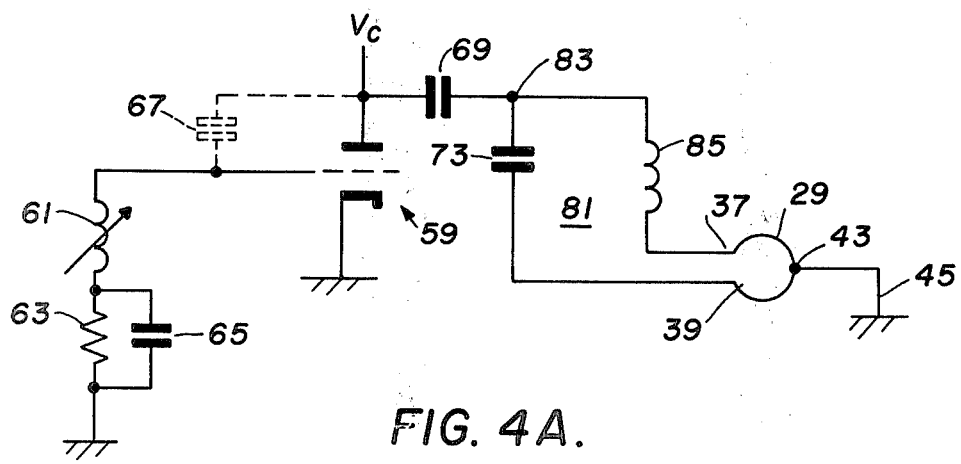
FIGS. 4A and 4B are schematic circuit diagrams showing an RF power oscillator circuits illustrating aspects of a first embodiment of the invention.

Referring now to FIG. 4A, the present invention contemplates an RF power oscillator circuit which differs from that of FIG. 3 by utilizing an inductive-capacitive tank circuit 81 which includes work coil 29. That is, the work coil is an integral part of the tank circuit.

The plate of tube 59 is connected through voltage-blocking capacitor 69 to an input node 83 of tank circuit 81. One input side 37 of work coil 29 is connected in a circuit including an inductor 85 to input node 83. Capacitor 73 is connected between the input node and the other side 39 of work coil 29. The center tap 43 serves as the ground node of the tank circuit.

Thus, tank circuit 81 is inductive-capacitive in character and is, of course, resonant at the predetermined frequency which is desired for zone refining operation. It may be noted that work coil 29 is of an inductive character. It is conceivable, therefore, that under some conditions (e.g., at higher frequencies) that inductor 85 may be omitted. In such event, input side 37 of the work coil would have a direct circuit connection to input node. However, at a preferred operating frequency of 3 MHZ, inductor 85 may comprise one or more turns of cooled tubing forming a coil of diameter of up to ten centimeters or more. Capacitor 73 may have a capacitance of several thousand picofarads and a rating of more than 15 kilovolts. Such circuit elements, as well as work coil 29 may require cooling, e.g., by circulating highly purified water through heat exchangers and through the work coil.

The circuit of FIG. 4A is found to give more efficient power transformer than the oscillator to work coil 29 than the transformer-coupled circuit of FIG. 3. In addition, this improved direct-coupled circuit allows the RF impedance presented to the oscillator circuit to be varied over a wide range by varying either capacitor 73 or inductor 85.

Yet another improvement of the above-described circuit having a significant operational advantage is the provision of the grounded center tap 43 of work coil 29. It is found that such a center tap balances the voltage stress to ground at points on the surface of work coil 29. For this purpose, it is preferred by voltage measurement under test conditions to determine the electrical center of the work coil. This electrical center may not be coincident with the geometric center between the opposite input sides 37 and 39. When the center tap 43 is located at the electrical center of the coil (which takes into effect differences and other factors effecting the electric field of the coil), substantially equal peak voltages occur at the opposite input sides. Accordingly, this arrangement effectively minimizes arcing. Such arcing is prohibitive to a normal zone refining operation. If it should occur, the entire zone refining operation may be terminated, since there is the possibility of ruining the crystalline structure of rod 11 by introducing dislocations through thermal shock.

While the circuit configuration of FIG. 3A is found to provide the advantages noted above, it is found that such a direct-doupled arrangement may exaggerate or worsen certain undesirable operating conditions, such as instability, which result from the previously noted interaction between the heat of the melt (molten zone), the size of the molten zone, and the power output of the oscillator circuit. One practical problem associated with this shortcoming is an operator difficulty in accurately controlling the circuit, as is required at various points during a zone refining operation. To adjust power, it is common practice to vary the magnitude of the plate supply voltage $V_C$. The instability referred to above makes it somewhat difficult for the operator to accurately control the size and heat of the molten zone through variation in the supply voltage.

Figure 4B:
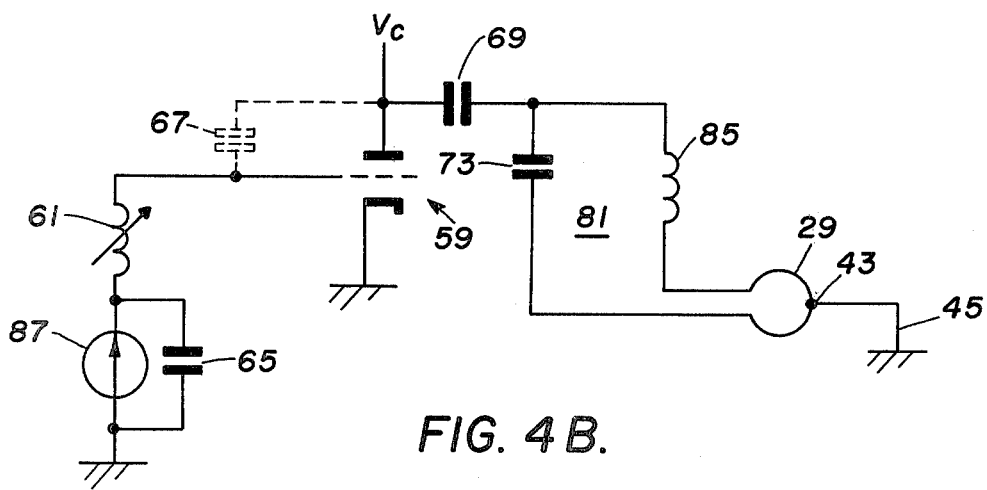

The stability characteristics of the oscillator are improved by modifying the circuit of FIG. 4A as shown in FIG. 4B, wherein a constant current source 87 is placed in series with the grid circuit, replacing the grid leak resistor 63. This improved circuit tends to force vacuum tube 59 to operate with constant grid current and hence more nearly independently of the RF load constituted by the work coil 29 and molten zone 13. Thus, even though there are changes in RF load on the tank circuit caused by changes in the molten zone which, because they cause changes in the magnitude of the RF current circulating in the tank circuit, produce undesirable operating conditions, the current source 87 tends to force tube 59 toward more stable operating conditions which are desirable.

Oscillator circuits of the present type require class-C amplifiers. That is, circuit operation such that the grid bias is appreciably greater than the cutoff value of the vacuum tube, so that the anode (plate) current in the tube flows for appreciably less than half of the period each cycle of oscillation. In other words, the tube is periodically conductive only during a conduction angle substantially less than half the period of oscillation.

With this in mind, another advantage of the circuit of FIG. 4B is that the current source 87 tends to prolong the conduction angle. Thus the tube is forced to pump more energy to the tank circuit during the cycle. In this the circuit is more efficient, a desirable operating condition.

Figure 5:
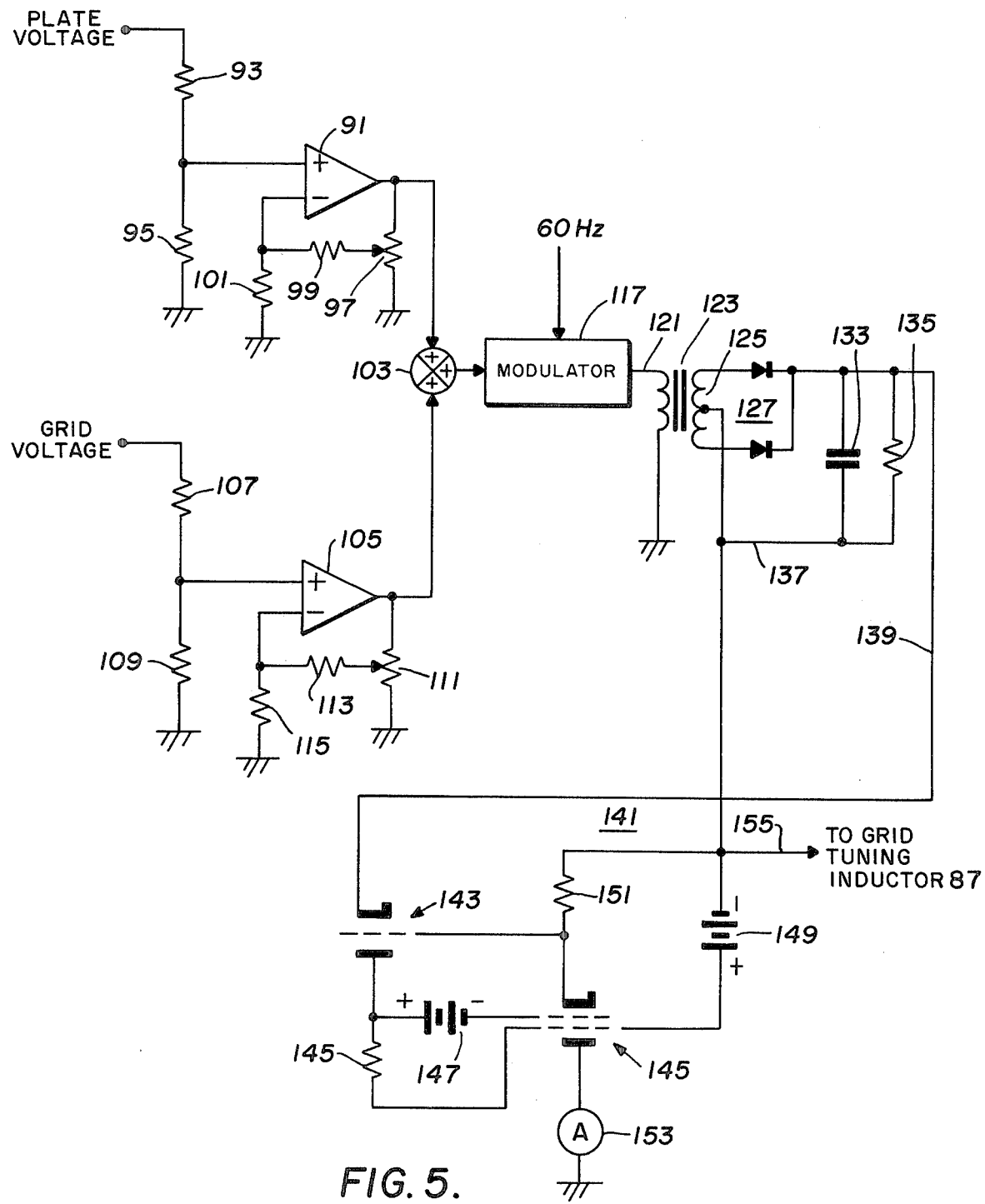
FIG. 5 is a schematic circuit diagram of control circuitry in accordance with a further embodiment of the invention.

A circuit for more precise control than the constant grid current modification of FIG. 4A is that shown in FIG. 5. The circuit of FIG. 5 constitutes a control circuit for replacing the current source 87 in the circuit of FIG. 4A. The circuit includes means for sensing the operating parameters of vacuum tube 59 and means for supplying a signal, i.e., a grid control current of varying magnitude, to the grid of the tube. This magnitude is a function of the tube's operating parameters i.e., the plate voltage and the grid voltage, the current supplied by this circuit being increased in magnitude in response to increased in the sensed plate and gride voltages.

For this purpose, the plate voltage of tube 59 is supplied to the noninverting input of a conventional monolithic operational amplifier 91 of the differential type by means of a suitable voltage divider constituted by resistors 93 and 95. A gain control circuit comprising a potentiometer 97 and resistors 99 and 101 is interconnected between the output of operational amplifier 91 and its inverting input. The output is connected to a summing junction 103. Thus, operational amplifier 91 is used to sense the plate voltage.

A similar circuit having an operational amplifier 105 is used to sense the grid voltage. It includes an input voltage divider for the noninverting input having resistors 107 and 109 and a similar gain control circuit having resistance elements 111, 113 and 115. The output of operational amplifier 105 is connected to summing junction 103.

Summing junction 103 provides the composite signal from the two voltage sensing circuits to a conventional chopper or modulator 117 which has a 60 Hz signal applied thereto as shown at 119 to produce at its output 121 a 60 Hz signal whose magnitude varies as a function of the grid and plate voltages.

A transformer 123 having a center-tapped secondary winding 125 is employed to deliver this signal to a discriminator circuit 127 comprising diodes 129 and 131, a capacitor 133 and resistor 135 thereacross to provide between leads 137 and 139 a d.c. potential which is a function of the plate and grid voltages.

This d.c. potential is employed to control the operation of voltage-to-current converter circuit 141 comprising a triode vacuum tube 143 and a tetrode vacuum tube 145. As will be apparent, triode 143 in conjunction with its plate resistor 147 and a bias voltage source 149 controls the conduction of tetrode 145. A bias voltage source for the second or screen grid of tetrode 145 is shown at 149. A cathode resistor is designated 151 and an ammeter 153 is shown for measuring a grid current which is provided by circuit 141 to grid tuning inductor 87 by a lead 155. Thus, it should be understood that lead 155 extends to the bottom of inductor 87 (FIG. 4B) and that the current source 87 may then be regarded as having been replaced by the present circuit.

Accordingly, the circuit of FIG. 5 is seen to include circuit means 127 for deriving a control potential or voltage (i.e., that voltage between leads 137 and 139) which is a direct function of the sensed plate and grid voltages and circuit means 141 serving as a current source for producing a control current of magnitude which is directly proportional to this control voltage, and means, including the interconnection of the plate-cathode circuit of tetrode 145 with tuning inductor 87, for supplying the control current to the grid of tube 59.

Figure 6:
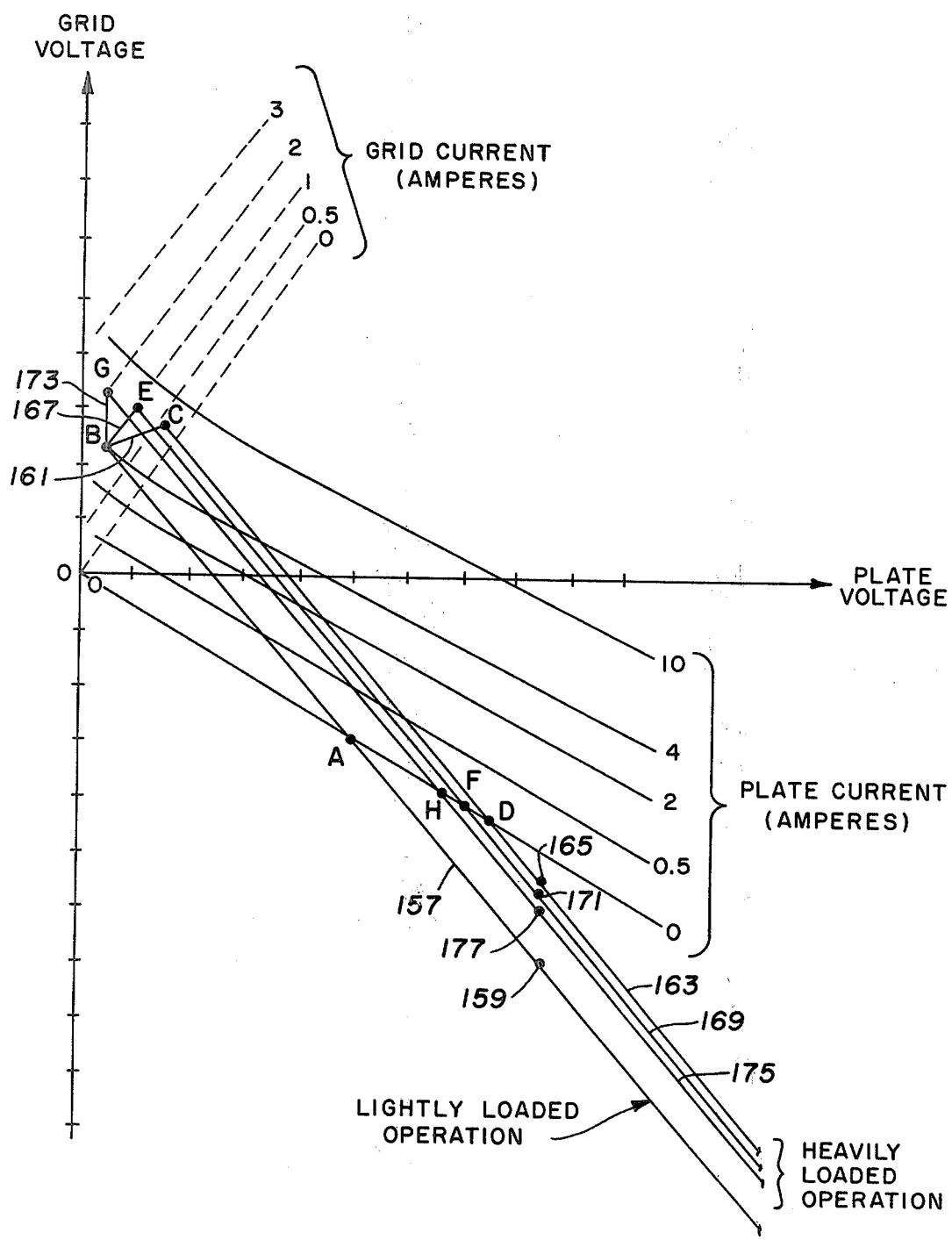
FIG. 6 is a graph illustrating operating conditions and characteristics of the circuit of FIG. 4.

FIG. 6 illustrates the operations of not only the circuit of FIG. 4A but the embodiments represented by FIG. 4B and FIG. 5.

The constant-current operating characteristics of vacuum tube 59 are here depicted as a family of curves representing various grid currents, on a plot of instantaneous grid voltage (ordinate) versus instantaneous plate voltage.

At 157 is shown a typical load line representative of lightly loaded operation of any of the circuits of FIGS. 4A, 4B and 5. An average operating point is shown at 159. The lower right side of this and other load lines is not shown in order to keep the graph of reasonable size, it being understood that there are normal excursions of plate voltage and grid voltage about the average operating point. The tube is seen to be conductive for points on the load line between points A and B but in cut off (nonconductive) for points on the load line to right of point 163.

When the RF load on the circuit is increased (by coupling RF energy into the molten zone), the load line for the circuit of FIG. 4A follows a locus 161 in which the grid current is seen to decrease from that value associated with lightly loaded operation to a point C. The load line for the circuit of FIG. 4A under such heavily loaded operation is designated 163 and the average operating point is shown at 165. Cutoff occurs at point D.

However, when using the circuit of FIG. 4B having a constant current source, the increase in RF load producing heavily loaded operation produces a locus 167 between points B and E. Heavily loaded operation is then represented by a load line 169 having an average operating point 171. Cutoff occurs at point F.

On the other hand, when the circuit of FIG. 4B is modified by employing the circuit of FIG. 5 to provide a grid control signal, the change from lightly loaded to heavily loaded operation defines a locus 173 between points B and G. From this it is seen that the grid current is increased substantially in going from a light load to a heavy RF load, as is desirable for the reasons previously described. A load line for these conditions is designated at 175 with an average operating point at 177. Cutoff occurs at point H.

In view of the foregoing, it will be seen that the several objects of the invention are achieved and other advantages are attained.

As various changes could be made in the constructions herein described without departing from the scope of the invention, it is intended that all matter contained in the foregoing description or shown in the accompanying drawings shall be interpreted as illustrative rather than in a limiting sense.

What is claimed is:

1. Apparatus for zone refining rods of semiconductive material, said apparatus comprising means for positioning a rod of semiconductive material for zone refining, an RF induction work coil for RF induction heating of said rod to produce a molten zone in said rod by inductively coupling RF energy to said rod, said coil having a single turn lying in a plane generally transverse to the lengthwise axis of said rod, said turn encircling said rod, means for causing relative movement between said work coil and said rod to cause said molten zone to pass along the length of said rod, an RF power oscillator circuit including a power amplifying device having a control electrode and a power output electrode, said power output electrode being connected through a voltage-blocking capacitance to an input node of a direct coupled inductive-capacitive tank circuit, said direct coupled tank circuit including said work coil and a capacitance, one input side of said work coil being connected in a circuit to said input node, said capacitance being connected between said input node and the other input side of said work coil, said work coil having a grounded center tap serving as a ground note of said direct coupled tank circuit.

2. Apparatus as set forth in claim 1 wherein said direct coupled tank circuit further includes inductor, said inductor being in said circuit connecting said one input side of said work coil to said input node.

3. Apparatus as set forth in claim 1 wherein said center tap is at the electrical center of said work coil between the input sides thereof whereby said center tap causes substantially equal peak voltages at the opposite input sides of said work coil.

4. Apparatus as set forth in claim 1 wherein said amplifying device is periodically conductive only during a conduction angle substantially less than the period of oscillation of said oscillator circuit and wherein changes in RF load on said direct coupled tank circuit caused by changes in the molten zone in said semiconductor rod tend to cause changes in the magnitude of RF current circulating in said direct coupled tank circuit which in turn tend to produce undesirable operating conditions of said amplifying device during said conduction angle, said apparatus further comprising a grid current control means interconnected with said control electrode for forcing said amplifying device toward desirable operating conditions.

5. Apparatus as set forth in claim 4 wherein said amplifying device comprises a vacuum tube, said control electrode comprising a grid of said tube, said power output electrode comprising a plate of said tube.

6. Apparatus as set forth in claim 5 wherein said control means comprises a source of substantially constant grid current for said grid.

7. Apparatus as set forth in claim 4 wherein said control means comprises means for sensing the operating parameters of said amplifying device and means for supplying a signal to said control electrode of a magnitude which is a function of said operating parameters.

8. Apparatus as set forth in claim 7 wherein said amplifying devices comprises a vacuum tube, said parameters comprising the voltage at said power output electrode and the voltage at said control electrode, said signal supplied to said control electrode being increased in magnitude in response to increases of said sensed voltages.

9. Apparatus as set forth in claim 8 wherein said power output electrode comprises a plate of said tube and said control electrode comprises a grid of said tube, said sensing circuit comprising first operational amplifier means for sensing the voltage at said plate, second operational amplifyier means for sensing the voltage at said grid, means for deriving a control voltage which is a direct function of said sensed voltages, a current source for producing a current of magnitude which is a direct function of said control voltage, and means for supplying the current produced by said current source to said grid, the last-said current constituting said signal supplied to said control electrode.

10. Apparatus for zone refining rods of semiconductive material, said apparatus comprising means for positioning a rod of semiconductive material for zone refining, an RF induction work coil for RF induction heating of said rod to produce a molten zone in said rod by inductively coupling RF energy to said rod, said coil having a single turn lying in a plane generally transverse to the lengthwise axis of said rod, said turn encircling said rod, means for causing relative movement between said work coil and said rod to cause said molten zone to pass along the length of said rod, an RF power oscillator circuit including a power amplifying vacuum tube having a rid constituting a control electrode and a plate constituting a power electrode thereof, said plate being connected through a voltage blocking capacitance to a direct coupled inductive-capacitive tank circuit, said direct coupled tank circuit comprising a capacitor, an induction coil and said work coil, one end of each of said induction coil and said capacitor each being connected to said input node, the other end of said induction coil being connected to one input end of said work coil, the other end of said capacitor being connected to the other of the input ends of said work coil, said work coil having a grounded center tap, said tap causing substantially equal peak voltages at the inputs of said work coil, said vacuum tube being periodically conductive only during a conduction angle substantially less than the period of oscillation of said oscillator circuit and wherein changes in RF load on said direct coupled tank circuit caused by changes in the molten zone in said semiconductor rod tend to cause changes in the magnitude of RF current circulating in said direct coupled tank circuit which in turn tend to produce undesirable operating conditions of said vacuum tube during said conduction angle, and a grid current control means interconnected with said grid for forcing said vacuum tube toward desirable operating conditions.

11. Apparatus as set forth in claim 10 wherein said control means is adapted for forcing said condition angle during heavy RF load conditions to be increased from the conduction angle otherwise obtainable during such heavy RF load conditions.

12. Apparatus as set forth in claim 11 wherein said control means is adapted for modifying current flowing into said grid to increase said conduction angle.

13. Apparatus for zone refining rods of silicon, said apparatus comprising means for positioning a rod of silicon for zone refining, an RF induction work coil for RF induction heating of said rod to produce molten zone in said rod by inductively coupling RF energy to said rod, said coil having a single turn lying in a plane generally transverse to the lengthwise axis of said rod, said turn encircling said rod, means for causing relative movement between said work coil and said rod to cause said molten zone to pass along the length of said rod, an RF power oscillator circuit including a power amplifying vacuum tube having a grid constituting a control electrode and a plate constituting a power electrode thereof, said plate being connected through a voltage blocking capacitance to the input node of a direct coupled inductive-capacitive tank circuit, said direct coupled tank circuit comprising a capacitor, an induction coil, and said work coil, said one end of each of said capacitor and said induction coil being connected to said input node, the other end of said capacitor being connected to one input end of the work coil, the other end of said induction coil being connected to the other input end of the work coil, said work coil having a grounded center tap, said tap causing substantially equal peak voltages at the inputs of said work coil, said vacuum tube being periodically conductive only during a conduction angle substantially less than the period of oscillation of said oscillator circuit and wherein changes in RF load on said direct coupled tank circuit caused by changes in the molten zone in said silicon rod tend to cause changes in the magnitude of RF current circulating in said direct coupled tank circuit which in turn tend to produce undersirable operating conditions of said vacuum tube during said conductive angle, and a grid current control means interconnected with said grid for forcing said vacuum toward desirable operating conditions.

* * * * *